United States Patent [19]
Smith

[11] Patent Number: 6,008,749
[45] Date of Patent: Dec. 28, 1999

[54] MASK PROGRAMMABLE LOW POWER VOLTAGE/CURRENT-MODE ADC

[75] Inventor: Malcolm Harold Smith, Macungie, Pa.

[73] Assignee: Lucent Technologies, Inc., Murray Hill, N.J.

[21] Appl. No.: 08/995,303

[22] Filed: Dec. 22, 1997

[51] Int. Cl.[6] .................................................. A03M 1/40
[52] U.S. Cl. ........................................................ 341/163
[58] Field of Search .................................. 341/163, 164, 341/165, 172

[56] References Cited

U.S. PATENT DOCUMENTS

| | | | |
|---|---|---|---|
| 4,831,381 | 5/1989 | Hester | 341/172 |
| 5,212,486 | 5/1993 | Nagaraj | 341/172 |
| 5,367,302 | 11/1994 | Kalthoff et al. | 341/166 |
| 5,489,904 | 2/1996 | Hadidi | 341/156 |
| 5,619,203 | 4/1997 | Gross, Jr. et al. | 341/144 |
| 5,661,483 | 8/1997 | Negahban et al. | 341/161 |
| 5,831,562 | 11/1998 | Van Auken et al. | 341/122 |

*Primary Examiner*—Brian Young

[57] ABSTRACT

An integrated circuit for converting an analog input signal to a corresponding digital signal. The integrated circuit has selectable operational modes and comprises a digital-to analog converter (DAC) to produce a variable reference voltage, a sample and hold circuit for sampling and holding the analog input signal to produce a sampled and held analog input signal, a comparator for comparing the reference voltage with the sampled and held analog input signal to produce a difference signal, a converter to convert the difference signal into the digital signal and related to the difference signal, and a selector for the operational modes. The operational modes may be one of a single ended current mode, a single ended voltage mode, a differential current mode and a differential voltage mode.

6 Claims, 7 Drawing Sheets

MASK PROGRAMMABLE LOW POWER VOLTAGE/CURRENT-MODE ADC

FIELD OF THE INVENTION

The present invention relates to a successive-approximation analog-to-digital converter (ADC), and more particularly to a successive approximation ADC able to operate with single-ended or differential current or voltage signals for use in wireless and other low-power applications.

BACKGROUND OF THE INVENTION

A conventional successive-approximation ADC includes a digital-to-analog converter (DAC), a comparator, and a successive approximation register (SAR). The comparator receives the input voltage and the output of the DAC. The DAC receives the output of the SAR. On the first cycle of the conversion, the SAR begins by producing a digital output that is one-half the full-scale value. On the second cycle the SAR produces an output that is halfway between its previous output and zero if the comparator indicates that the input voltage is less than the output of the DAC, and produces an output that is halfway between its previous output and the full-scale value if the comparator indicates that the input voltage is greater than the output of the DAC. On successive cycles, the SAR continues to produce outputs halfway between two previous outputs or between a previous output and zero or between a previous output and the full-scale value. A successive approximation ADC thus performs a binary search until it arrives at a digital output that corresponds most closely to the analog input.

Several types of DACs are known in the art. The simplest type of DAC is known as a weighted-resistor DAC because it includes a network of resistors connected to a summing node. The bits of the input word are connected to corresponding switches, such as transistors. Each switch connects one of the resistors into the network if the corresponding bit is high ("1") and disconnects the resistor from the network if the corresponding bit is low ("0"). The resistor has a value that is weighted according to the position of the bit. The summing node sums the currents contributed by the resistors that are switched into the network, thereby producing a current that corresponds to the digital input. An op-amp is typically included to convert this current into a voltage output. A modified type of weighted-resistor DAC, known as a R-2R ladder DAC, has a resistor network that minimizes the range of resistor values. Similar types of DACs are known that use a capacitor network rather than a resistor network. A related type of DAC, known as a binary-weighted current sink DAC, includes weighted current sources rather than weighted resistors. Each bit controls a group of transistors, such as bipolar transistors or metal-oxide semiconductor field-effect transistors (MOSFETs), corresponding in number to the weight of the bit. The number of transistors in the group controlled by the $n^{th}$ bit is $2^n$. The gates of the MOSFETs in each group are coupled to each other and to the controlling bit. The sources and drains of the MOSFETs in each group are also coupled to each other. An N-bit binary-weighted current sink DAC thus requires $2^n-1$ transistors.

A DAC is typically implemented in an integrated circuit or chip. The precision of the resistors and the offset voltage of the transistors of a DAC affect its accuracy. Current sink DACs are preferred because they minimize the number of resistors and thus the cumulative error. Current sink DACs can be implemented using common chip fabrication processes such as the bipolar metal-oxide semiconductor (BiMOS), complementary metal-oxide semiconductor (CMOS), and bipolar complementary metal-oxide semiconductor (BiCMOS) process. CMOS and BiCMOS chips are advantageous because they are more power-efficient than many other processes.

ADCs are available as either differential or single-ended input devices. ADCs are also available as voltage mode devices or current mode devices. Depending on circuit design constraints a designer will use one of these four types of ADCs in their design. Because there are so many possible configurations needed, manufactures must design and maintain many different types of ADCs. This is costly in both the design and configuration control stages.

Furthermore, as mentioned above, conventional successive approximation ADCs use a large resistor chain which in turn results in a large overall circuit. As circuit designs become more compact, use of such large ADCs is a great disadvantage.

These problems and deficiencies are clearly felt in the art and are solved by this invention in the manner described below.

SUMMARY OF THE INVENTION

The present invention relates to an integrated circuit for converting an analog input signal to a corresponding digital signal. The integrated circuit has selectable operational modes and comprises a digital-to analog converter (DAC) to produce a variable reference voltage, a sample and hold circuit for sampling and holding the analog input signal to produce a sampled and held analog input signal, a comparator for comparing the reference voltage with the sampled and held analog input signal to produce a difference signal, a converter to convert the difference signal into the digital signal and related to the difference signal, and a selector for the operational modes. The operational modes may be one of a single ended current mode, a single ended voltage mode, a differential current mode and a differential volt age mode.

The present invention further relates to a method for converting an analog signal to a digital signal by selectively coupling components within an ADC to configure the ADC in one of four operational modes.

DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION OF THE INVENTION

Figure 1:
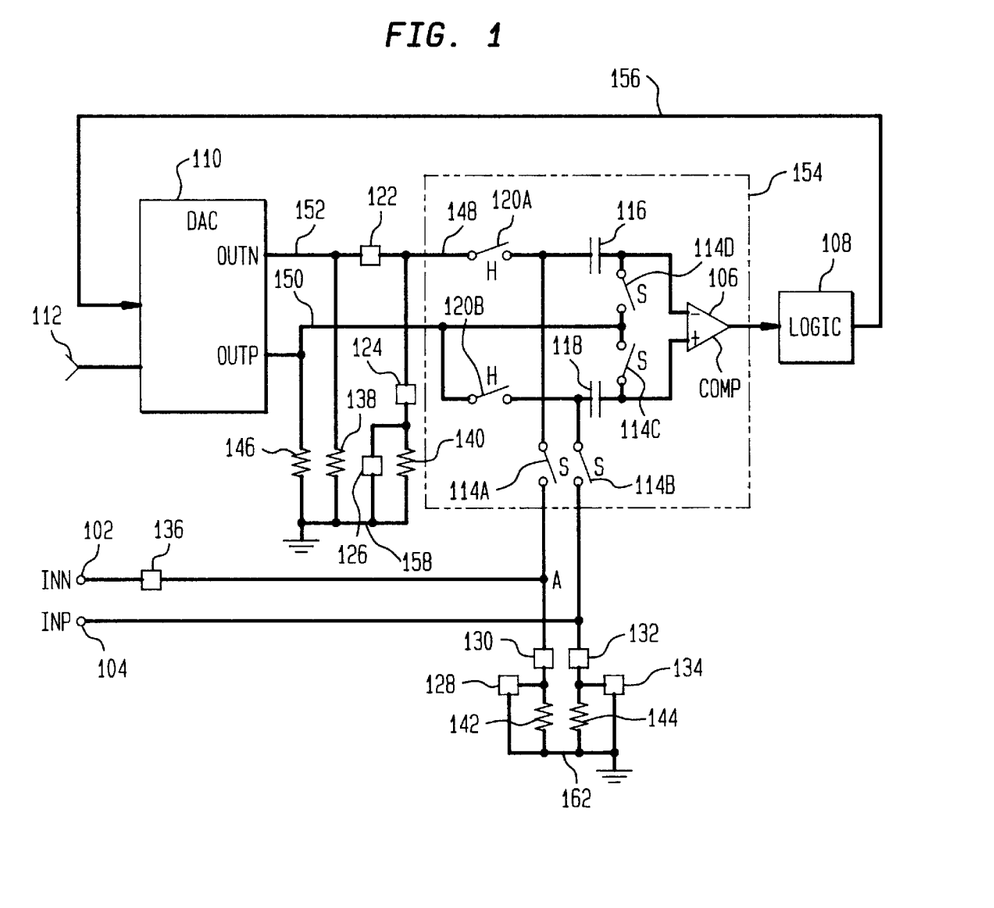
FIG. 1 is a circuit diagram of an exemplary embodiment of the present invention.

Referring to FIG. 1 an exemplary embodiment of ADC 100 of the present invention is shown. The exemplary embodiment of the present invention is a voltage mode ADC for which current input signals are converted to a voltage using resistors. DAC 110 is used to produce a signal for comparison at comparator 106. DAC 110 is a current steering DAC which uses resistors 146 and 138 to convert a current signal output on signal line 150 and 152 into a voltage signal, respectively. Sample-and-hold circuit 154 is fully differential and may be used as a pseudo-differential circuit for single-ended operation. A bias circuit (shown in FIGS. 4A and 4B) also has voltage and current mode versions for compatibility with the ADC 100.

Four distinct modes of operation are incorporated in ADC 100. In order to implement the various modes, mask features 122, 124, 126, 128, 130, 132, 134, and 136 are required to selectively connect or disconnect components to the circuit and thereby alter the mode of ADC 100. FIG. 1 shows the basic circuit of ADC 100 with the extra devices and optional mask features.

Sample-and-hold circuit 154 consists of capacitors 116, 118 one side of which are connected to the inverting or non-inverting inputs, respectively, of comparator 106. The other end of capacitors 116, 118 are connected to sample switches 114A and 114B, respectively. Sample switches 114C and 114D are connected to the non-inverting and inverting inputs of comparator 106, respectively. Sample switches 114C and 114D are closed during the sampling phase to a non-inverting reference signal line 150 which is set to half of the full swing value during sampling. Sample switches 114A and 114B are also closed during the sampling process and couple the input from negative input signal (INN) 102 and positive input signal (INP) 104 to capacitors 116 and 118, respectively, depending on the operational mode of ADC 100. These operational modes are discussed below. The difference between the reference signal and the input signals INN and INP are stored in capacitors 116 and 118 for use during the hold phase of sample-and-hold circuit 154. The reference signals are generated by current steering DAC 110 which generates a differential current signal, consisting of two weighted currents, depending on the input word from logic 108 over signal line 156.

ADC 100 is a fully differential voltage-mode successive-approximation device. The basic configuration is as follows. INP 102 is coupled to one side of sample switch 114B and one side of mask feature 132. The other side of mask feature 132 is coupled to resistor 144 and mask feature 134. The other side of resistor 144 and mask feature 134 are each coupled to ground rail 162. INN 102 is coupled to mask feature 136 which is in turn coupled to mask feature 130 and sample switch 114A. Mask feature 130 is coupled to mask feature 128 and resistor 142. The other side of resistor 142 and mask feature 128 are each coupled to ground rail 162. Reference signal (REF) 112 is coupled to DAC 110. In the exemplary embodiment, REF 112 may be either a voltage reference or a current reference signal depending on the chosen circuit configuration. A positive output current (OUTP) from DAC 110, present on signal line 150, is coupled to resistor 146 which has a second end coupled to ground rail 158. OUTP is also coupled to hold switch 120B and sample switches 114C and 114D. A negative output current (OUTN) from DAC 110, present on signal line 152, is coupled to resistor 138 which has a second end coupled to ground rail 158 and mask feature 122. Resistors 138 and 146 share ground rail 158 to facilitate noise rejection. The result of coupling DAC 110 to resistors 138 and 146 is the production of differential voltage signals. The other side of mask feature 122 is coupled to mask feature 124 and hold switch 120A. Mask feature 124 is coupled to mask feature 126 and resistor 140. The other side of resistor 140 and mask feature 126 are each coupled to ground rail 158. The other end of hold switch 120A is coupled to sample switch 114A and capacitor 116. Capacitor 116 is in turn coupled to sample switch 114D and the negative input of comparator 106. Hold switch 120B is coupled to sample switch 114B and capacitor 118. Capacitor 118 is in turn coupled to sample switch 114C and the positive input of comparator 106. The output of comparator 106 is coupled to logic 108 which in turn is coupled to DAC 110 through signal line 156.

Figure 2A:
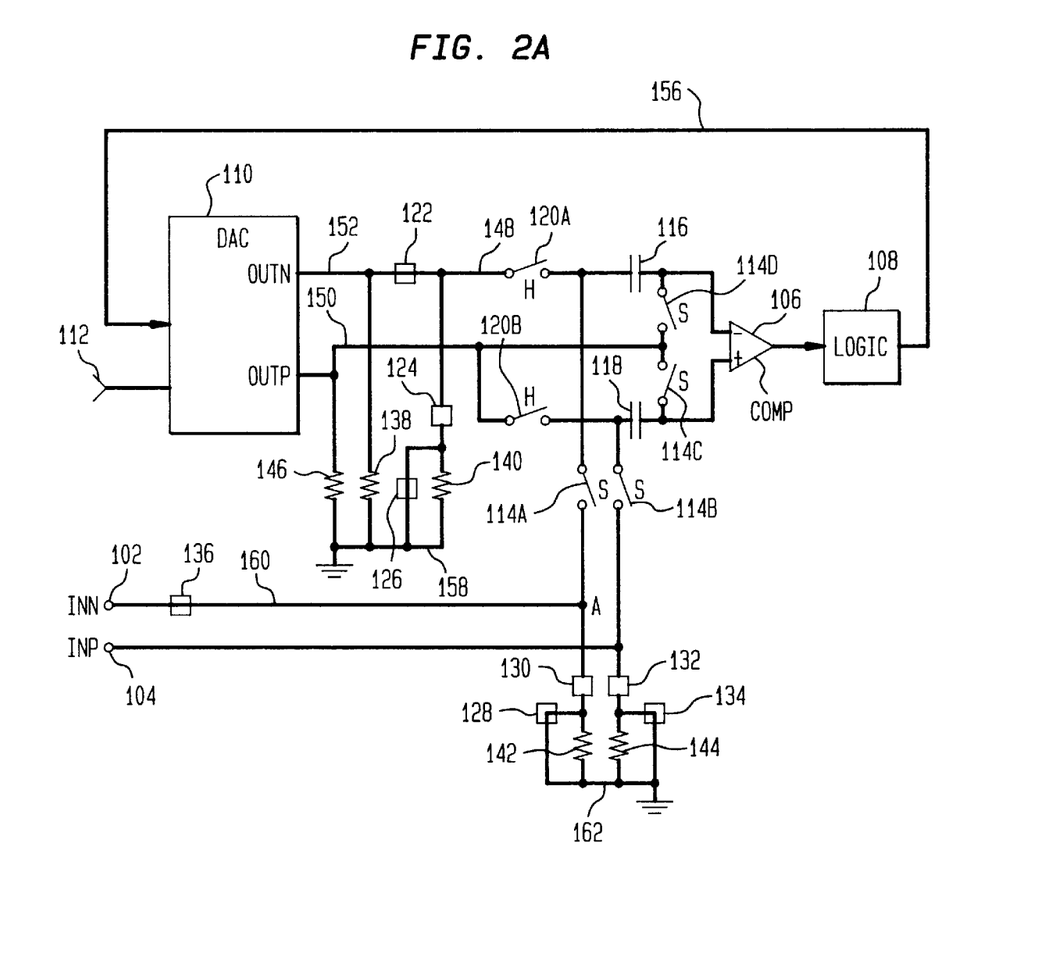
FIG. 2A is a circuit diagram of the circuit of FIG. 1 in a differential voltage mode configuration.

Referring now to FIG. 2A a schematic diagram of the exemplary embodiment of FIG. 1 is shown configured in the differential voltage mode. In the exemplary embodiment, various devices, such as resistors 140, 142, and 144 are incorporated, but not connected if the device is to be used as a differential voltage mode device. In FIG. 2A, the selection of certain mask features enables the differential voltage mode of operation of ADC 100. In particular, mask features 122, 126, 128, 134 and 136 are enabled in this exemplary embodiment. OUTN of DAC 110 is connected to hold switch 120 through mask feature 122 and INN 102 is connected to signal line 160 through mask feature 136. Resistors 140, 142 and 144 are unused in this mode and are connected to ground through mask features 126, 128 and 134, respectively.

Figure 2B:
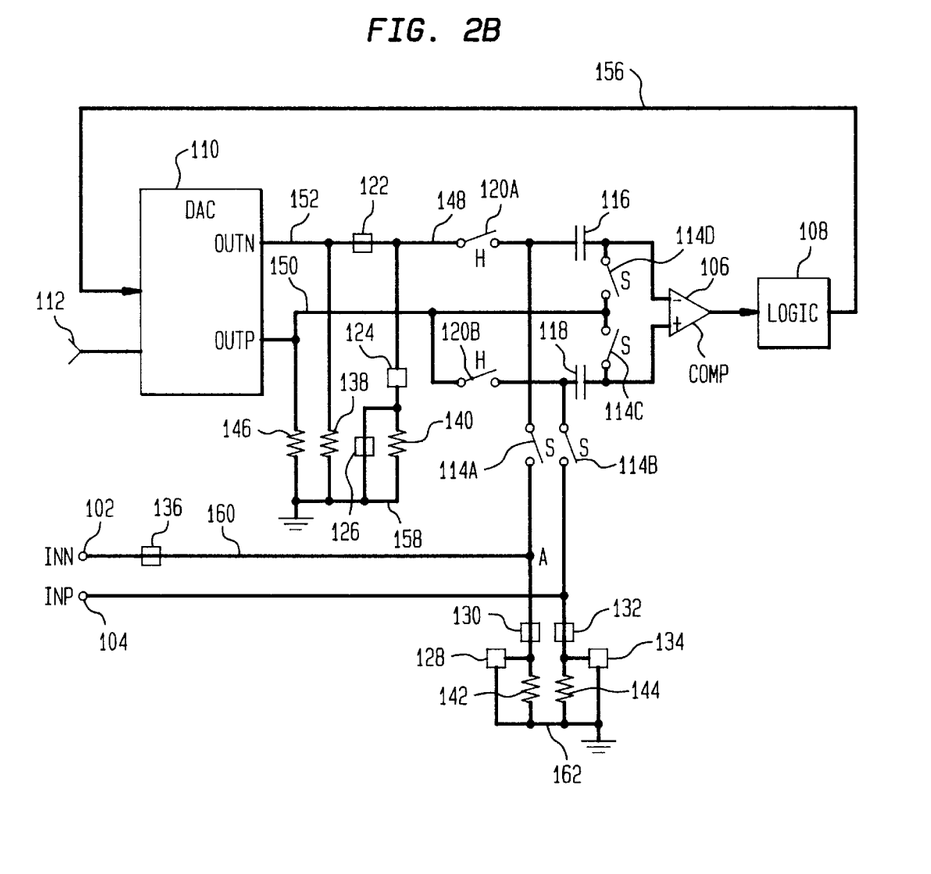
FIG. 2B is a circuit diagram of the circuit of FIG. 1 in a differential current mode configuration.

Referring now to FIG. 2B a schematic diagram of the exemplary embodiment of FIG. 1 is shown configured in the differential current mode. In FIG. 2B, mask features 122, 126, 130, 132 and 136 are enabled. Mask features 122, 126 and 136 were detailed above and an explanation of these connections will not be repeated. Signal line 160 is connected to resistor 142 through mask feature 130 and sample switch 114B is connected to resistor 144 through mask feature 132. This results in resistors 142 and 144 being connected between the inverting and non-inverting inputs of comparator 106 and ground rail 162, respectively. Resistors 142 and 144 are matched to the level of the converter, and share the same ground reference to ensure that any noise on the ground rail 162 is coupled equally into both sides of sample-and-hold circuit 154 and hence rejected as a common-mode signal.

Figure 3A:
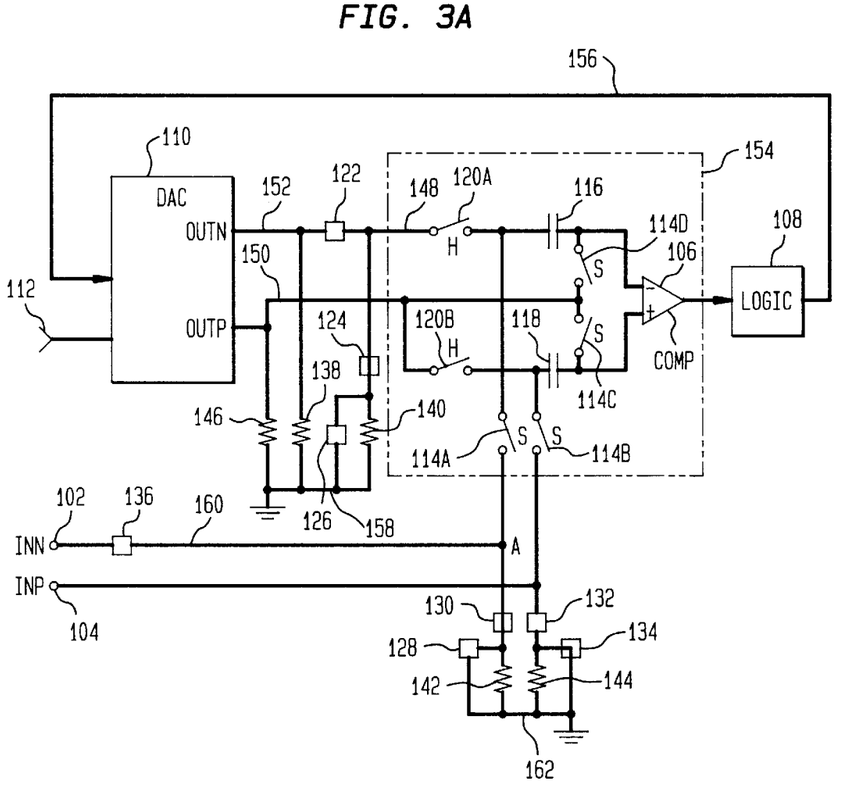
FIG. 3A is a circuit diagram of the circuit of FIG. 1 in a single-ended voltage mode configuration.

Referring now to FIG. 3A a schematic diagram of the exemplary embodiment of FIG. 1 is shown configured in the single-ended voltage mode. In FIG. 3A, sample-and-hold circuit 154 is configured as a pseudo-differential circuit. Signal line 160, which is normally connected to INN 102, is coupled to ground through mask feature 130 and resistor 142. Resistor 144 is unused and is coupled to ground through mask feature 134. Signal line 148 is also coupled to ground through mask feature 124 and resistor 140. Resistor 138 is used to sink the OUTN current present on signal line 152 to ensure that any parasitic resistance on the ground side of the reference resistors does not introduce signal distortion. INN 102 is disconnected and the pad may be left unbonded or bonded to a no-connect pin in this configuration. Comparator 106 may be designed with extra gain to make up for the 6 dB loss typically experienced when using a differential circuit as a single-ended circuit.

Figure 3B:
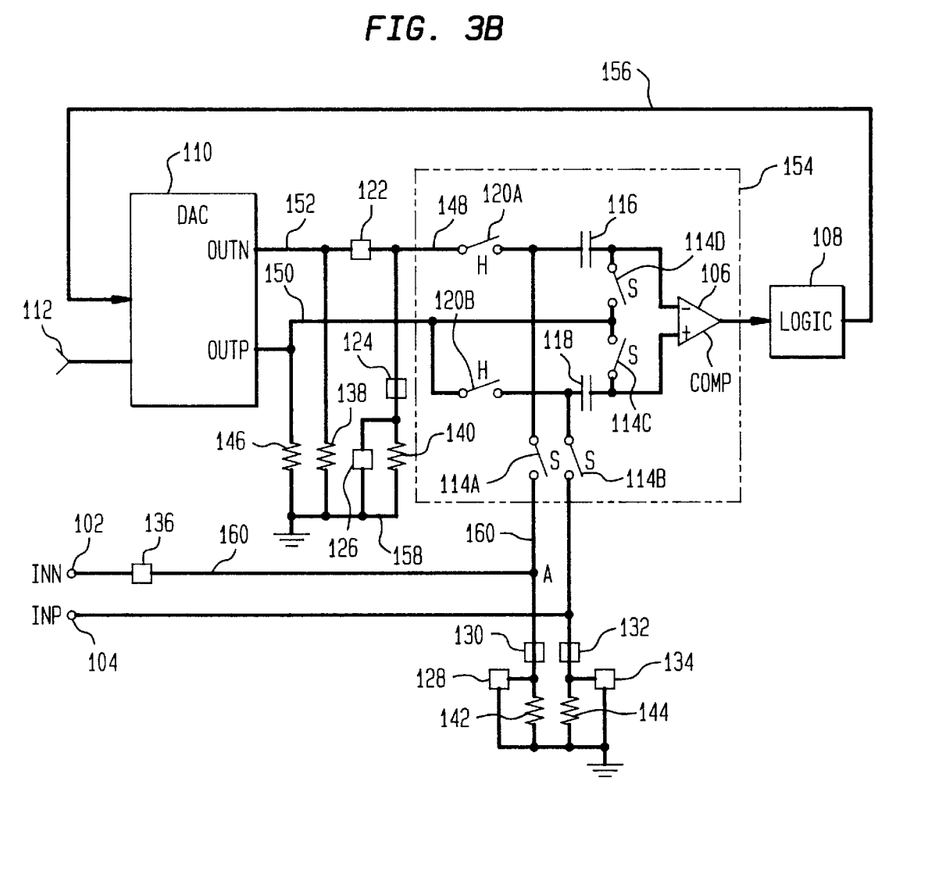
FIG. 3B is a circuit diagram of the circuit of FIG. 1 in a single-ended current mode configuration.

Referring now to FIG. 3B a schematic diagram of the exemplary embodiment of FIG. 1 is shown configured in the single-ended current mode. In FIG. 3B, sample-and-hold circuit 154 is again configured as a pseudo-differential circuit. Signal line 160, which is normally connected to the INN 102, is coupled to ground through mask feature 130 and resistor 142. INP 104 is coupled to ground through mask feature 132 and resistor 144. Signal line 148 is also tied to ground through mask feature 124 and resistor 140. In this configuration mask features 122, 126, 128 and 134 are not used and remain in an open state. Resistor 138 is used to sink the OUTN current present on signal line 152 to ensure that any parasitic resistance on the ground side of the reference resistors does not introduce signal distortion. INN 102 is disconnected and the pad may be left unbonded or bonded to a no-connect pin in this configuration. Comparator 106 may be designed with extra gain to make up for the 6 dB loss typically experienced when using a differential circuit as a single-ended circuit.

As mentioned above, the various options are selectable by a single mask change and may be made during the production process. This results in the ability to create four distinctly different circuits from a single circuit design.

ADC 100 also includes biasing for the analog circuits on the chip and may be selectable on the same mask as that used to select the four options discussed above.

Figure 4A:
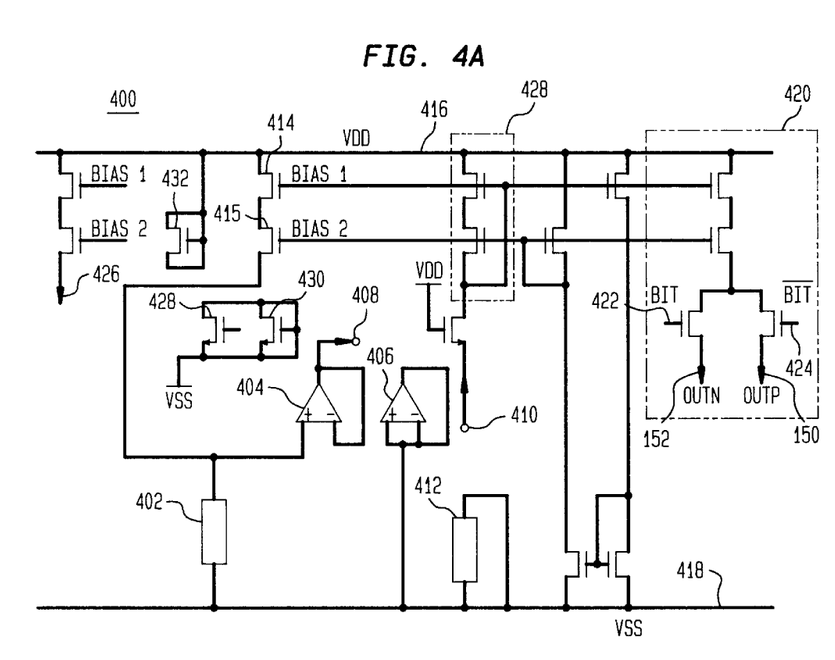
FIGS. 4A and 4B are circuit diagrams of biasing circuits of an exemplary embodiment of the present invention.

FIG. 4A is a schematic diagram of a current mode version of bias circuit 400. Referring to FIG. 4A, input 410 is supplied with an external current reference (IREF$_{ext}$) and in turn generates a reference voltage (VREF) at output 408. In this mode, the device will use the same accurate reference current for both DAC 110 and the internal circuitry. IREF$_{ext}$ is used at the input to current mirror 428 that supplies all of the current for the DAC as well as the internal currents. VREF is generated by using an external resistor 402 connected to op amp 404 to which an accurate current is supplied from bias transistors 414 and 415 so as to achieve an accurate voltage value. The current supply circuit operates even when the ADC is turned off if other parts of the chip are operating. Therefore, traditional power down circuits are not used, and the switches 422 and 424 that steer the current between the OUTP 150 and OUTN 152 are shut off when the ADC is powered down.

Figure 4B:
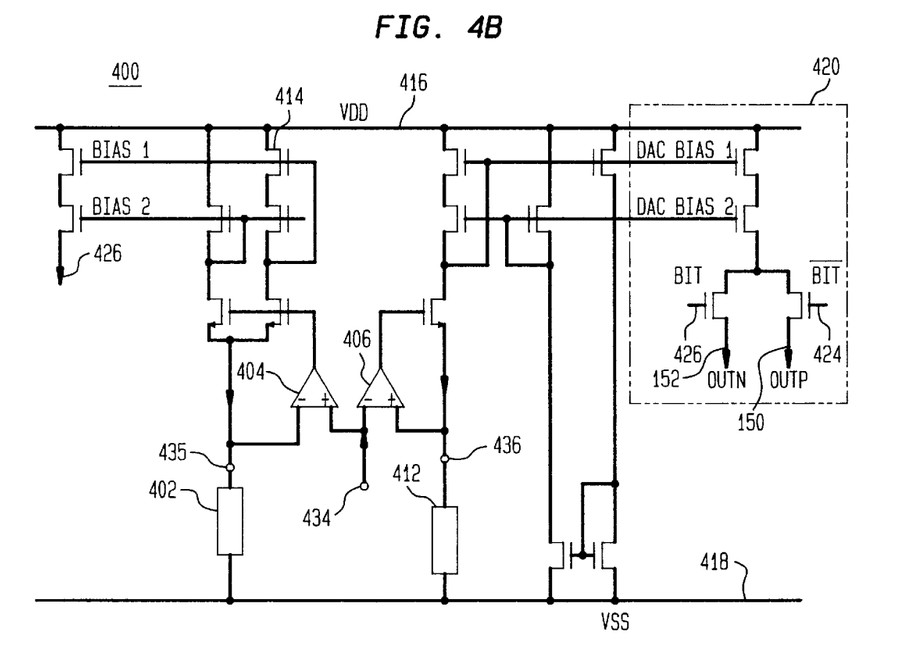

FIG. 4B is a schematic of a voltage mode version of bias circuit 400. Referring to FIG. 4B, input 434 is supplied with an external reference voltage (VREF$_{ext}$) and in turn generates two reference currents, IREF at output 434 and DAC IREF at output 436. DAC IREF is used to drive DAC 110 and may be proportional to the resistances used to generate the DAC output voltages.

The bias current for DAC 110 may be generated using the internal resistor that matches the resistor in DAC 110 used to generate the reference voltages for comparison. VREF is supplied to ADC 100 and reference current IREF is generated through external resistor 402 using this reference voltage. This is achieved by reconnection of the circuits used to generate the reference voltage and bias currents in the current mode ADC. As mentioned above, the power down mode for DAC 110 is achieved by turning off current steering switch transistors 424 and 426.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for converting an analog input signal to a corresponding digital signal in a circuit and selecting an operational mode for the circuit, the method comprising the steps of:
    (a) selectively varying a reference voltage;
    (b) sampling and holding the analog input signal to produce a sampled and held analog input signal;
    (c) comparing the reference voltage with the sampled and held analog input signal to produce a difference signal;
    (d) converting the difference signal into the digital signal and related to the difference signal;
    (e) converting the digital signal to produce the selectively varying reference voltage; and
    (f) selecting the operational mode by providing one or more of the following:
        a resistance between a further reference and the analog input signal, when the circuit is in one of i) a single ended current mode, and ii) a differential current mode;
        a bias resistance between the reference voltage and the further reference, when the circuit is in one of i) the single ended current mode and ii) a single ended voltage mode; and
        the application of a portion of the reference voltage to the sampled and held analog input signal, when the circuit is in one of i) a differential voltage mode and ii) the differential current mode.

2. A method for converting an analog input signal to a corresponding digital signal in a circuit and selecting an operational mode for the circuit, the method comprising the steps of:
    (a) selectively varying a first reference voltage and a second reference voltage;
    (b) sampling and holding the analog input signal to produce a sampled and held analog input signal;
    (c) comparing at least the first reference voltage with the sampled and held analog input signal to produce a difference signal;
    (d) converting the difference signal into the digital signal, the digital signal related to the difference signal;
    (e) converting the digital signal to produce the selectively varying reference voltage; and
    (f) selecting the operational mode by providing one or more of the following:
        a first resistance between a further reference and a first signal of the analog input signal, when the circuit is in one of i) a differential current mode and ii) a single ended current mode;
        a second resistance between the further reference and a second signal of the analog input signal, when the circuit is in the differential current mode;
        the second resistance between the further reference and the sampled and held analog input signal, when the circuit is in one of i) a single ended voltage mode and ii) the single ended current mode;
        a third resistance between the further reference and the sampled and held analog input signal, when the circuit is in one of i) the single ended current mode and ii) the single ended voltage mode; and
        the application of the second reference voltage for comparison in Step (c) to the sampled and held analog input signal, when the circuit is in one of i) a differential voltage mode and ii) the differential current mode.

3. An integrated circuit for converting an analog input signal to a corresponding digital signal, said integrated circuit having selectable operational modes and comprising:
    a digital-to analog converter (DAC) to produce at least one variable reference voltage;
    a sample and hold circuit for sampling and holding the analog input signal to produce a sampled and held analog input signal;
    a comparator for comparing the variable reference voltage with the sampled and held analog input signal to produce a difference signal;

a converter to convert the difference signal into the digital signal and related to the difference signal;

said converter coupled to said DAC for converting the digital signal to produce the variable reference voltage; and a selector for the operational modes to select one or more of the following:
  a resistance coupled between a reference and the analog input signal, when the integrated circuit is in one of i) a single ended current mode, and ii) a differential current mode;
  a bias resistance coupled between the variable reference voltage and the further reference, when the integrated circuit is in one of i) the single ended current mode and ii) a single ended voltage mode; and
  the variable reference voltage coupled to the sample and hold circuit, when the integrated circuit is in one of i) a differential voltage mode and ii) the differential current mode.

4. An analog-to-digital converter (ADC) for converting an analog input signal to a corresponding digital signal, said ADC having an operational mode and comprising:
  a digital-to analog converter (DAC) to produce a first and a second variable reference voltage;
  a sample and hold circuit for sampling and holding the analog input signal to produce a sampled and held analog input signal;
  a comparator for comparing at least the first reference voltage with the sampled and held analog input signal to produce a difference signal;
  a converter to convert the difference signal into the digital signal and related to the difference signal;
  said converter coupled to said DAC for converting the digital signal to produce the variable reference voltage; and
  a selector for the operational modes to select one or more of the following
    a first resistance coupled between a further reference and a first signal of the analog input signal, when the ADC is in one of i) a differential current mode and ii) a single ended current mode;
    a second resistance coupled between one of i) the further reference and a second signal of the analog input signal, when the ADC is in the differential current mode and ii) the further reference and the sampled and held analog input signal, when the ADC is in one of 1) a single ended voltage mode and 2) the single ended current mode;
    a third resistance coupled between the further reference and the sampled and held analog input signal, when the ADC is in one of i) the single ended current mode and ii) the single ended voltage mode; and
    the second reference voltage coupled to the sample and hold circuit, when the ADC is in one of i) a differential voltage mode and ii) the differential current mode.

5. An analog-to-digital converter (ADC) according to claim 3, wherein, the DAC produces another variable reference voltage which is selectively coupled to at least one input of the comparator.

6. An analog-to-digital converter (ADC) according to claim 4, wherein, the first reference voltage is selectively coupled to at least one input of the comparator.

* * * * *